Dec. 12, 1972 L. S. KELEM ET AL 3,706,049

TIME OSCILLATOR CALIBRATOR CIRCUIT

Filed Jan. 4, 1972 2 Sheets-Sheet 1

TIMER LOGIC

United States Patent Office 3,706,049

Patented Dec. 12, 1972

3,706,049

TIME OSCILLATOR CALIBRATOR CIRCUIT

Lester S. Kelem, Rockaway, and Stephen E. Reade, Hillside, N.J., assignors to the United States of America as represented by the Secretary of the Army Filed Jan. 4, 1972, Ser. No. 215,376
Int. Cl. H03b 3/00
U.S. Cl. 331—44 9 Claims

ABSTRACT OF THE DISCLOSURE

A calibration circuit for a fuze time oscillator which includes the application of the pulses from a highly accurate oscillator to a time/base counter whose output is applied to inhibit an AND gate upon the receipt of a selectable number of pulses (time). The pulses emanating from the fuze oscillator are fed through the AND gate to an 11 stage counter and to another 11 stage binary counter of a like number of stages. After the selected fixed period the input to the 11 stage counter is inhibited but the binary counter continues to receive the pulses. Upon filling up of the binary counter the fuze oscillator output is again applied to the 11 stage counter until it fills up and provides an output which inhibits both itself and the binary counter. The binary is now left unfilled to the extent of a specific number of pulse from the fuze oscillator which is equal to the time initially set in the time base counter by the accurate oscillator. Therefore, the binary will count out at the selected time thereafter, thus providing a specific, accurate period and this time factor will be independent of the relative accuracy of the fuze oscillator and its frequency.

Figure 1:
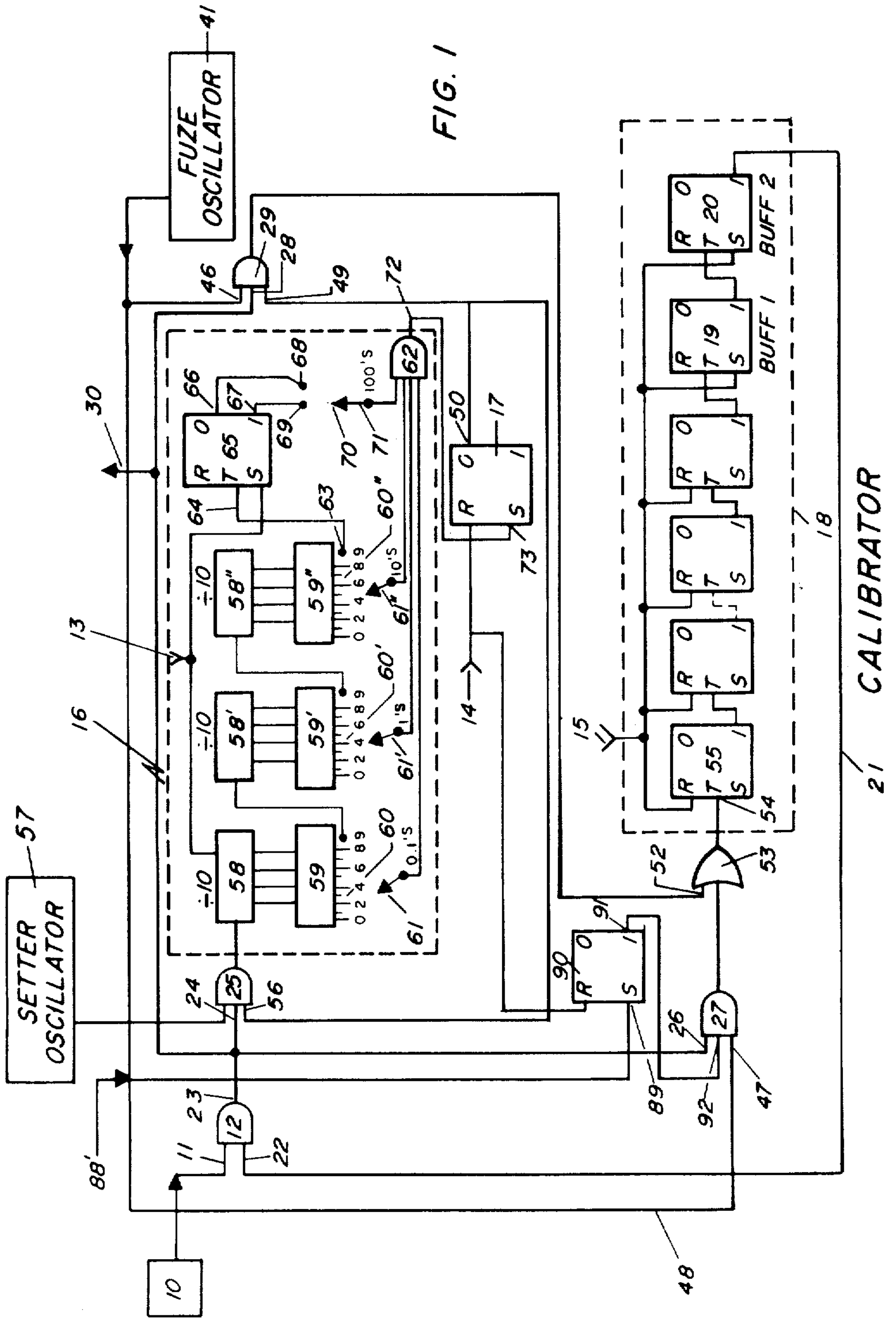

The invention described herein may be manufactured, used and licensed by or for the Government for governmental purposes without the payment to us of any royalty thereon.

BACKGROUND OF THE INVENTION

The present invention relates to the calibration of oscillators and more particularly pertains to a digital timing system wherein any inaccuracies of the operational oscillator are calibrated prior to use against an accurate or setter oscillator to provide a selected, fixed time period.

In the field of oscillator and timing calibration it has been the general practice to employ physical design considerations in order to minimize any inherent drift induced by aging. There, however, exists a cost-quality trade-off which must be considered during the system design stage. Thus, the less complex, the more probable it is that the quality of the system will suffer due to the inability to compensate for the drift. Clearly, an expensive oscillator can be designed, built, and trimmed for accuracy but in the case of extended storage it is difficult to predict or ascertain if such an oscillator can be in fact designed and constructed. The present invention provides a digital circuit wherein the timing oscillator is accurately calibrated immediately prior to its operational employment without the necessity of using expensive, close tolerance components.

SUMMARY OF THE INVENTION

The general purpose of this invention is to provide an oscillator or timing calibration circuit that has all the advantages of similarly employed prior art devices and has none of the above described disadvantages. To attain this, the present invention provides a unique digital circuit arrangement wherein logic circuitry permits the application of the pulses from a highly accurate controlled oscillator to be applied to a binary coded decimal counter provided with a selectable time switch and to inhibit the simultaneous application of the operational oscillator pulse train to a plurality of tandem connected flip-flop circuits upon the decimal counter having received the requisite number of pulses corresponding to the selected time period. Via a serial gate these operational oscillator pulses are also applied to a binary counter having a number of stages equal to the flip-flops or bistable multivibrators and is not inhibited by the run out of the decimal counter. When the input pulses completely fill the binary counter the next succeeding pulse induces a check output pulse which enables another input to the multivibrators to again receive the operational oscillator pulses until it is filled plus one pulse upon which event it inhibits itself as well as the binary counter. Thus, by properly selecting the frequency of the calibrated setter oscillator the time required for the pulses of the operational oscillator to fill the binary counter is exactly equal to the time to which the decimal counter was initially set. This calibrated time period is entirely independent of the accuracy of the operational oscillator frequency.

An object of the present invention is to provide an apparatus for calibration of a timing oscillator which is relatively inexpensive, simple to operate, and does not depend on high tolerance components.

Another object of the subject invention is the provision of digital circuitry for period calibration of an oscillator immediately prior to employment of the oscillator as a timer and, independent of its frequency.

Still a further object is to provide a digital calibrator for the fuze oscillator of a projectile wherein the oscillator is time set immediately prior to launch.

Figure 2:
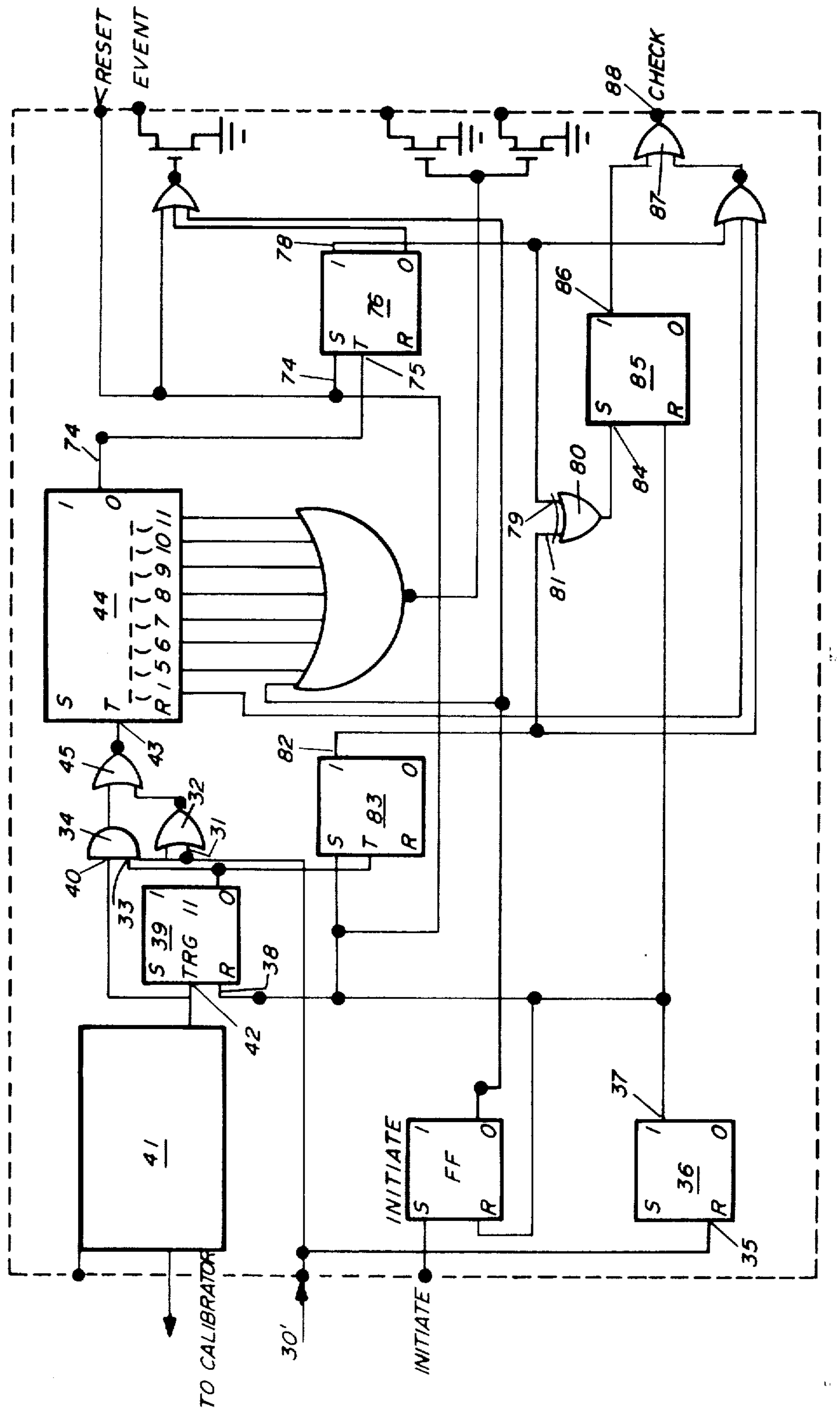

Other objects and many of the attendant advantages of this invention will be readily appreciated as the same becomes better understood by reference to the following detailed description when considered in connection with the accompanying drawings wherein:

FIG. 1 is a schematic of an embodiment of the fuze oscillator calibrator made in accordance with the principle of this invention; and, FIG. 2 is a schematic of the timer logic used in conjunction with the embodiment of FIG. 1.

DESCRIPTION OF A PREFERRED EMBODIMENT

In the illustrated embodiment of FIG. 1 an initiate or start control 10 applies a voltage or a "1" to input 11 of AND gate 12 while at the same time a reset signal has appeared at reset inputs 13, 14 and 15 resetting the counters of digital time switch 16, multivibrator or flip-flop (FF) 17 and all the FF's of binary 18 while setting FF buffers 19 and 20. The reset input therefore provides a "1" at the set output of buffer 20 which is applied by connection 21 to the other input 22 of enabled AND gate 12 thus placing a "1" at its output 23 and at input 24 of AND gate 25, input 26 of AND gate 27, at input 28 of AND gate 29 as well as the serial gate output 30 which is connected to serial gate input 30' of the timer logic (see FIG. 2). This places a "1" at input 31 of OR gate 32, at input 33 of AND gate 34 and a "1" at the reset input 35 of FF 36 which applies the "1" at the set output 37 to the reset input 38 of digital (2048) 11 stage scaler 39. This reset input holds the scaler reset so that it is effectively inhibited during the period of the serial gate input. The output of the fuze oscillator 41 is simultaneously applied to the trigger input 42 of the inhibited scaler 39 and input 40 of enabled AND gate 34 whose fuze oscillator pulse output appears at the trigger input 43 of 11 stage binary counter 44 via OR gate 45. Thus upon the application of the voltage to input 11, fuze oscillator pulses are applied to the binary counter 44 and are also being applied (see FIG. 1) to input 46 of AND gate 29 and input 47 of inhibited AND gate 27 via line 48. The other input 49 of AND gate 29 receives a "1" from the R output 50 of already reset FF 17, whereby the fuze oscillator pulses appear at output 51 of AND gate 29 and fed into input 52 of OR gate 53 and therefrom into the trigger input 54 of the first flip-flop 55 of binary 18.

With the application of the reset to FF–17 the "1" from the R output 50 is applied to input 56 of AND gate 25 to enable it and allow the accurate pulse train from the setter oscillator 57 to input the digital time switch 16. The setter oscillator should preferably be of the crystal controlled type to insure extremely high stabiliy and accuracy. The switch 16 includes a plurality of digital stages each including a divide by ten binary coded decimal counter 58 whose binary outputs are connected to a binary to decimal converter 59 whose output is in the form of contacts 60 with the last contact thereof providing the binary input to the next succeeding binary coded decimal counter. A time setting switch 61 is provided for each stage with the pole output of each switch connected to a separate input at AND gate 62. The last decimal output terminal 63 is applied to the trigger input 64 of FF–65 whose reset 66 and set 67 outputs are the fixed or stationary contacts 68 and 69 of SPDT switch 70. The pole 71 contact is applied to another input of AND gate 62 whose output 72 is fed into the set input 73 of FF–17.

It is clear from the foregoing that upon the receipt of a voltage at input 11 of AND gate 12 and a reset input, the following will simultaneously occur:

(1) The input to selectable time counter 16 will be enabled and it will receive the setter oscillator pulse train.

(2) The input (AND gate 29 and OR gate 53) to the binary 18 will be enabled and receive the fuze oscillator pulses.

(3) The serial gate will open a voltage window whereby the fuze oscillator pulses will directly enter the binary counter 44.

Thus, all the counters are initially enabled and proceed to count the input pulses with a particular time setting on the digital time switch 16, as for example, 1187 corresponding to 118.7 seconds. For this setting upon the receipt of 1187 input pulses at the binary coded decimal counter, AND gate 62 will be enabled and provide a "1" output which in turn switches FF–17 from a "1" output at 50 to a "0" which is reflected to input 56 of AND gate 25 and input 40 of AND gate 29 whereby they are both inhibited. Fuze oscillator pulses continue to enter binary counter 44. It is assumed that since the fuze oscillator to be calibrated is less stable and accurate than the setter oscillator, a different number of pulses will have entered the counter 18 via AND gate 29. This number can be either greater or less than the 1187 setter pulses. Upon the entrance of the 2048th pulse into the binary counter 44 the trigger output 74 switches from "0" to "1" that is applied to the trigger input 75 of FF–76 which was originally "set" by a reset input to input 77 so that its set output 78 switches to a "0." This "0" is applied to input 79 of exclusive OR 80, which also is receiving a "1" at input 81 from output 82 of FF–83 (originally set) thereby enabling the exclusive OR to apply a "1" at the set input 84 of FF–85. The set output 86 provides a "1" output through OR gate 87 to a check output 88 that is coupled to the calibrator of FIG. 1.

This check input is applied to the set or true input 89 of FF–90 which causes its output 91 to enable AND gate 27 via input 92. Thus the fuze oscillator pulses again enter FF–55 from line 48 via OR gate 53. The 2049th pulse changes the state FF buffer 20 to a "0" and thereby (input 22) inhibits AND gate 12 which in turn inhibits AND gate 27 as well as the serial gate 30 and AND gate 29. With the serial gate inhibited, AND gate 34 also becomes inhibited.

A mathematical treatment of the foregoing events with a time setting of 118.7 seconds, is as follows:

(1) Since the setter oscillator is extremely accurate 1187 pulses have entered the time counter 16 and if its frequency is $F_s$ then the time during which these pulses entered is $1187/F_s$ seconds, (2) During this time period the number of pulses entering binary 18 and binary counter 44 is the time period multipled by the fuze oscillator frequency $F_f$, or, namely, $$\frac{1187}{F_s}\times F_f$$

(3) Thereafter pulses only continue to enter the binary counter until it is filled plus one or 2049. This means that after binary 18 has been inhibited $$2049-\frac{1187F_f}{F_s}$$

pulses must enter the binary counter 44 before there is provided a check output pulse which again, (4) Permits the fuze pulses to enter the binary 18 while they continue to enter the binary counter 44. When the 2049th pulse has entered the binary 18, the binary counter 44 will also be inhibited and when reactivated by an initiate signal it will require an additional $$2049-\left(2049-\frac{1187F_f}{F_s}\right)$$

pulses to time out. This is the equivalent of $1187F_f/F_s$ but these pulses are made to enter through the scaler 39 and since it effectively divides by 2048 then the period to time out is:

$$\frac{1187F_f}{F_s}\times\frac{1}{F_f}\times 2048$$

or $$\frac{1187\times 2048}{F_s}$$

which time is independent of the fuze oscillator frequency and with $F_s$=20,480 Hz. the time is 118.7 seconds.

It should be understood, of course, that the foregoing disclosure relates to only a preferred embodiment of the invention and that numerous modifications or alterations may be made therein without departing from the spirit and the scope of the invention as set forth in the appended claims.

We claim:

1. A method for time selectively calibrating an oscillator against an accurate setter oscillator which comprises the steps of:

applying the output pulse train from said setter oscillator to a selectable time base counter while simultaneously, applying the output pulse train from said oscillator to an "N" stage counter and a binary counter of a like number of stages, inhibiting the input to said "N" stage counter upon the receipt of a selected number by said time base counter, enabling and reapplying said oscillator pulses to said "N" stage counter subsequent to the filling-up of said binary counter, inhibiting further input to said binary counter upon the filling-up of said "N" stage counter, whereby said binary counter will time out and fill-up upon the receipt of oscillator pulses in the same time period as said time base counter was selectively set.

2. The method of claim 1 further including the step of:

scaling the input to said binary counter immediately prior to time out by a factor of $2^n$ and initiating said time out at a selected moment.

3. An apparatus for time calibrating an oscillator which comprises:

an accurate, stable setter oscillator, a time base selectable counter for receiving a pulse train and for providing an output signal upon the receipt of a selected number of pulses connected to receive the output of said setter oscillator and having its output connected to, a control means for controlling the application of the output pulses of said oscillator to, an "N" stage counter having its output connected to, an input control for said time counter, a binary counter of "N" stages connected to receive the output of said oscillator through, an alternate control, scaler means for providing an output pulse for every $2^n$ input pulses, initiating means for enabling said time counter, said binary counter and said control means, check output means for connecting said oscillator and said "N" stage counter upon the receipt of an output signal from said binary counter, means for inhibiting said alternate control and for thereafter enabling said alternate control for application of said oscillator to said binary counter through said scaler, whereby said binary counter under the input from said oscillator will time out in the exact same period as said time counter was initially set.

4. The apparatus according to claim 3 wherein said time counter includes a plurality of tandem connected stages, each stage including a binary coded decimal counter having its outputs connected to, a binary to decimal converter having its output connected to the input of the next succeeding decimal counter and provided with switch means having decimal output contacts and a movable pole for selective time positioning, said poles being connected to said control means.

5. The apparatus according to claim 4 wherein said input control includes:

a dual input AND gate having one input connected to said initiating means and the other input connected to the output of said "N" stage counter, a tri-input AND gate having one input connected to the output of said dual AND gate, another input connected to receive the output of said time base counter and the remaining input connected to the output of said setter oscillator and its output connected to the input of said time base counter.

6. The apparatus according to claim 5 wherein said check output means includes a second tri-input AND gate having its output connected to the input of said "N" stage counter, electrical means connecting one input of said second tri-input AND gate to the output of said oscillator, another input to said output of said dual AND gate and the remaining input to the output of said binary counter.

7. The apparatus according to claim 6 further including a bistable multivibrator intermediate said binary counter output and said remaining input of said second tri-input AND gate.

8. The apparatus according to claim 7 further including a time base counter output control means including a third tri-input AND gate having one input connected to said oscillator, another connected to the output of said dual AND gate and the remaining input connected to receive the output of said time base counter.

9. The apparatus according to claim 8 further including an OR gate having one input connected to the output of said third tri-input AND gate and the other input connected to receive the output of said second tri-input AND gate and having its output connected to the input of said "N" stage counter.

References Cited

UNITED STATES PATENTS 3,569,830 3/1971 Gass .............. 324—79 D

JOHN KOMINSKI, Primary Examiner

U.S. Cl. X.R.

324—79 D